(12) United States Patent
Vice

(10) Patent No.: US 7,230,807 B2
(45) Date of Patent: Jun. 12, 2007

(54) PROTECTION CIRCUIT FOR A TRANSISTOR

(76) Inventor: Michael W. Vice, 532 Palma St., El Granada, CA (US) 94018

( * ) Notice: Subject to any disclaimer, the term of this patent is extended or adjusted under 35 U.S.C. 154(b) by 0 days.

(21) Appl. No.: 11/012,705

(22) Filed: Dec. 15, 2004

(65) Prior Publication Data

US 2006/0126236 A1   Jun. 15, 2006

(51) Int. Cl.
*H02H 3/00*   (2006.01)
(52) U.S. Cl. .......................................... 361/56
(58) Field of Classification Search ............... 361/56
See application file for complete search history.

(56) References Cited

U.S. PATENT DOCUMENTS

| 4,789,917 | A | | 12/1988 | Miller |
| 5,528,188 | A | * | 6/1996 | Au et al. ................ 327/310 |
| 5,548,134 | A | | 8/1996 | Tailliet |
| 5,862,031 | A | | 1/1999 | Wicker et al. |
| 6,108,181 | A | | 8/2000 | Gerosa |
| 6,275,089 | B1 | | 8/2001 | Song et al. |

* cited by examiner

*Primary Examiner*—Ronald W. Leja

(57) ABSTRACT

A protection circuit for transistor that avoids the use of performance hindering resistors or diodes or capacitors includes a routing circuit for routing an electrostatic discharge current around the transistor and a detection circuit that switches on the routing circuit when a breakdown current in the transistor exceeds a threshold.

11 Claims, 1 Drawing Sheet

PROTECTION CIRCUIT FOR A TRANSISTOR

BACKGROUND

Transistors may be employed in a wide variety of electronic circuits including integrated circuits. Applications for transistors include amplifiers, digital processing circuits, RF circuits, DC circuits, and many other applications too numerous to mention.

A transistor may be vulnerable to breakdown caused by electrostatic discharge. For example, an electrostatic discharge may cause excessive current flow in the gate of a field-effect transistor (FET) and damage its gate structure. Breakdowns in an FET caused by electrostatic discharge may cause a failure of an entire integrated circuit as well as an entire electronic system or subsystem that employs a damaged FET.

One prior method for avoiding electrostatic discharge damage to an FET is to employ a relatively large resistor on the gate of the FET. A resistor at the gate of an FET may limit an amount of electrostatic discharge current into the FET and avoid damage to its gate structure. Unfortunately, a relatively large resistor on the gate of an FET may severely limit its performance in an amplifier application, e.g. by limiting gain and/or noise performance of an FET amplifier circuit.

Another prior method for avoiding electrostatic discharge damage to an FET is to employ diodes that limit an amount of reverse bias voltage on the gate of the FET. Unfortunately, diodes may hinder the performance of an FET amplifier and may not be practical in many other types of FET circuits.

Another prior method for avoiding electrostatic discharge damage to an FET is to employ capacitors that prevent electrostatic discharge current from reaching the gate of the FET. Unfortunately, the capacitors may not be practical in amplifier circuits and may increase the size and cost of integrated circuits.

SUMMARY OF THE INVENTION

A protection circuit for transistor is disclosed that avoids the use of performance hindering resistors or diodes or capacitors. A protection circuit according to the present teachings includes a routing circuit for routing an electrostatic discharge current around the transistor and a detection circuit that switches on the routing circuit when a breakdown current in the transistor exceeds a threshold.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
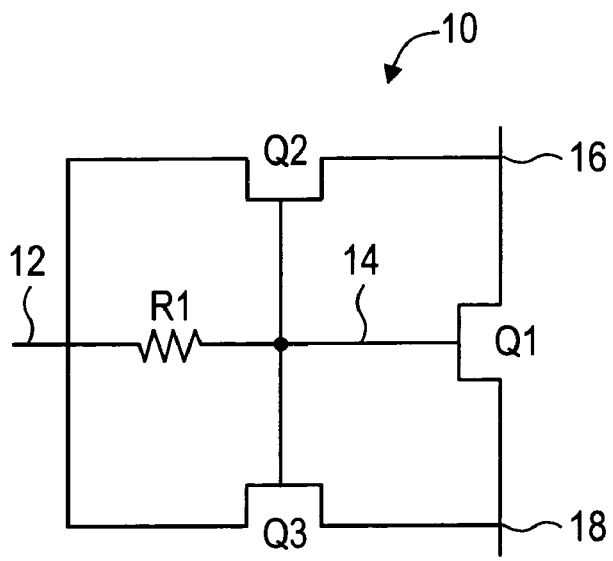
FIG. 1 shows a protection circuit for a transistor according to the present teachings.

FIG. 1 shows a protection circuit 10 for a transistor Q1 according to the present teachings. The protection circuit 10 prevents an electrostatic discharge current at a node 12 from damaging the transistor Q1.

The protection circuit 10 includes a pair of transistors Q2 and Q3 that provide a routing circuit for routing an electrostatic discharge current at the node 12 around the transistor Q1. The protection circuit 10 includes a resistor R1 that provides a detection circuit that switches on the routing circuit when a breakdown current in the transistor Q1 exceeds a threshold.

The resistor R1 is a component that detects the breakdown current by developing a voltage drop. A reverse breakdown begins when a significantly large negative voltage is applied at the node 12, e.g. an electrostatic discharge voltage. The resistor R1 draws the electrical current caused by the start of the reverse breakdown of the gate of the transistor Q1. The electrical current that flows through the resistor R1 causes a voltage drop across the resistor R1 that is more positive at a node 14 than the voltage at the node 12. The voltage drop across the resistor R1 switches on the transistors Q2 and Q3 and routes the electrostatic discharge current at the node 12 around the transistor Q1 to the nodes 16 and 18, thereby limiting the electrostatic discharge current at the gate of the transistor Q1 at the node 14.

The value of the resistor R1 is selected in response to amount of current in the gate of the transistor Q1 that would be significant but not yet high enough to damage the gate structure.

The transistors Q1–Q3 may be enhancement mode field-effect transistors.

Figure 2:
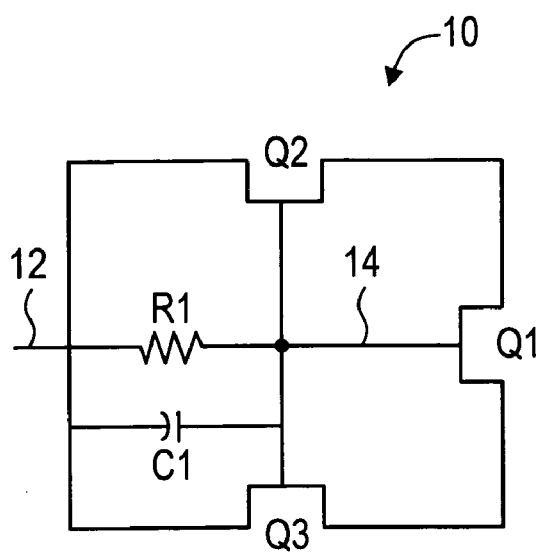
FIG. 2 shows an embodiment of the protection circuit that includes an AC signal bypass circuit.

FIG. 2 shows an embodiment of the protection circuit 10 that includes a bypass circuit, a capacitor C1, that enables an AC signal, e.g. an RF signal, to bypass the resistor R1 into the transistor Q1. The value of the capacitor C1 is selected in response to a lowest operating frequency for the transistor.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A protection circuit for a transistor comprising:
   routing circuit for routing an electrostatic discharge current around the transistor;
   detection circuit that switches on the routing circuit by detecting a breakdown current in the transistor;
   wherein the detection circuit comprises a resistor coupled between a node and a gate of the transistor.

2. The protection circuit of claim 1, wherein the resistor is selected in response to an amount of current in the gate that is significant but not destructive to the transistor.

3. A protection circuit for a transistor comprising:
   routing circuit for routing an electrostatic discharge current around the transistor;
   detection circuit that switches on the routing circuit by detecting a breakdown current in the transistor;
   a bypass circuit that enables an AC signal to bypass the detection circuit into the transistor.

4. The protection circuit of claim 3, wherein the bypass circuit comprises a capacitor.

5. The protection circuit of claim 4, wherein the capacitor is selected in response to a lowest operating frequency for the transistor.

6. A method for protecting a transistor from an electrostatic discharge current comprising detecting when a breakdown current in the transistor caused by the electrostatic discharge current exceeds a threshold and then routing the electrostatic discharge current around the transistor wherein detecting comprises developing a voltage drop across a component.

7. The method of claim 6, wherein developing comprises developing across a resistor.

8. The method of claim 7, further comprising selecting the resistor in response to an amount of current in the gate that is significant but not destructive to the transistor.

9. A method for protecting a transistor from an electrostatic discharge current comprising detecting means detecting when a breakdown current in the transistor caused by the electrostatic discharge current exceeds a threshold and then routing the electrostatic discharge current around the transistor, further comprising enabling an AC signal to bypass the detecting means into the transistor.

10. The method of claim 9, wherein bypassing comprises bypassing using a capacitor.

11. The method of claim 10, further comprising selecting the capacitor in response to a lowest operating frequency for the transistor.

* * * * *